United States Patent
Martin et al.

(10) Patent No.: US 7,954,001 B2
(45) Date of Patent: May 31, 2011

(54) NIBBLE DE-SKEW METHOD, APPARATUS, AND SYSTEM

(75) Inventors: Aaron K. Martin, Folsom, CA (US);
Hing Yan To, Cupertino, CA (US);
Mamun Ur Rashid, Folsom, CA (US);
Joe Salmon, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 12/133,003

(22) Filed: Jun. 4, 2008

(65) Prior Publication Data

US 2008/0244303 A1    Oct. 2, 2008

Related U.S. Application Data

(63) Continuation-in-part of application No. 11/172,149, filed on Jun. 30, 2005, now Pat. No. 7,401,246.

(51) Int. Cl.
*G06F 1/04* (2006.01)
*G06F 1/12* (2006.01)
*G06F 12/00* (2006.01)
*H03K 19/096* (2006.01)
*H03L 7/00* (2006.01)

(52) U.S. Cl. .......... 713/503; 713/400; 713/600; 326/96; 327/141; 711/105; 711/167

(58) Field of Classification Search .......... 713/400, 713/503, 600; 326/96; 327/141; 711/105, 711/167
See application file for complete search history.

(56) References Cited

U.S. PATENT DOCUMENTS

| | | | |
|---|---|---|---|
| 5,696,951 A * | 12/1997 | Miller | 713/503 |
| 5,923,198 A | 7/1999 | Fujioka | |
| 6,101,197 A | 8/2000 | Keeth et al. | |
| 6,292,116 B1 | 9/2001 | Wang et al. | |
| 6,424,592 B1 * | 7/2002 | Maruyama | 365/233.1 |
| 6,590,796 B2 | 7/2003 | Kobayashi | |
| 6,646,953 B1 | 11/2003 | Stark | |
| 6,690,757 B1 | 2/2004 | Bunton et al. | |
| 6,898,742 B2 | 5/2005 | Koyanagi et al. | |
| 7,031,420 B1 * | 4/2006 | Jenkins et al. | 375/371 |
| 7,230,857 B2 * | 6/2007 | Hyun et al. | 365/189.03 |
| 7,401,246 B2 | 7/2008 | Martin et al. | |
| 2002/0027964 A1 | 3/2002 | Yoo et al. | |
| 2003/0065987 A1 | 4/2003 | Ehmann et al. | |
| 2005/0033848 A1 | 2/2005 | Croome | |
| 2005/0120163 A1 | 6/2005 | Chou et al. | |
| 2006/0053328 A1 | 3/2006 | Panikkar et al. | |
| 2007/0006011 A1 | 1/2007 | Martin et al. | |

FOREIGN PATENT DOCUMENTS

| | | |
|---|---|---|
| EP | 1612690 A2 | 1/2006 |
| WO | WO-2004112421 A1 | 12/2004 |
| WO | WO-2007005590 A1 | 1/2007 |

OTHER PUBLICATIONS

"PCT Search Report", PCT Search Report and Written Opinion PCT Application No. PCT/US2006/025544, 1-10 Pgs., mailed Nov. 16, 2006.
International Preliminary Report on Patentability received for PCT Application No. PCT/US2006/025544, mailed on Jan. 17, 2008, 7 pages.

* cited by examiner

*Primary Examiner* — Stefan Stoynov
(74) *Attorney, Agent, or Firm* — Philip A. Pedigo

(57) ABSTRACT

De-skew is performed on a nibble-by-nibble basis where a nibble is not limited to four bits.

20 Claims, 5 Drawing Sheets

NIBBLE DE-SKEW METHOD, APPARATUS, AND SYSTEM

RELATED APPLICATION

This application is a Divisional of U.S. Nonprovisional Application Ser. No. 11/172,149, by Martin et al., filed Jun. 30, 2005, which is incorporated herein by reference in its entirety for all purposes.

FIELD

The present invention relates generally to input/output (I/O) circuits, and more specifically to I/O circuits with de-skew.

BACKGROUND

Memory devices are becoming faster. Input/output (I/O) circuits in memory devices, and I/O circuits that communicate with memory devices, should be fast enough to support the speed of memory devices. Skew (variations in phase) between individual bits within an interface is one problem that threatens to keep I/O circuits from supporting the ever-increasing speeds of memory devices.

Skew has typically been managed by closely matching the layout of integrated circuits and printed circuit boards to reduce the skew between all data signal traces coupled to a single memory device. Any remaining skew between the data signals and a received clock signal is then managed by de-skewing the clock relative to all of the data signals as a group.

DESCRIPTION OF EMBODIMENTS

Figure 1:
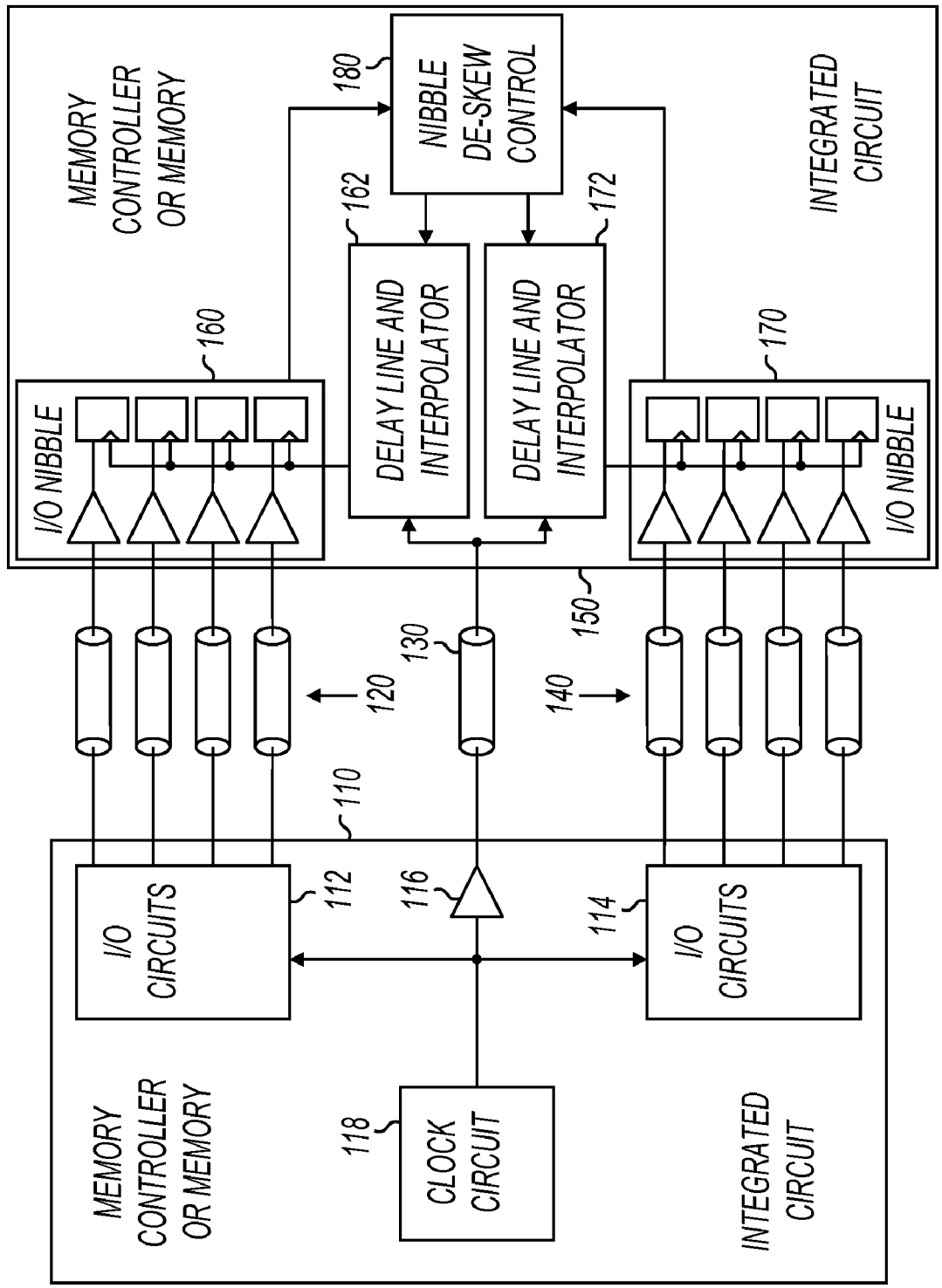
FIGS. 1 and 2 show diagrams of two coupled integrated circuits.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of two coupled integrated circuits. Either of integrated circuits 110 and 150 may be a memory controller or a memory device. For example, integrated circuit 110 may be a memory controller in a computer system, or may be a memory device such as a dynamic random access memory (DRAM) memory device. Also for example, integrated circuit 150 may be a memory controller or a memory device such as a DRAM.

Integrated circuit 110 includes I/O circuits 112 and 114, clock circuit 118 and clock driver 116. In some embodiments, clock circuit 118 may include a phase lock loop (PLL) to generate one or more clocks. In other embodiments, clock circuit 118 may receive one or more clock signals from a source external to integrated circuit 110. Clock driver 116 receives a clock signal from clock circuit 118 and drives a clock signal off of integrated circuit 110.

I/O circuits 112 and 114 form an I/O circuit that includes segments. For example, I/O circuit 112 is one segment and I/O circuit 114 is another segment. I/O circuits may include any number of segments without departing from the scope of the present invention.

I/O circuits 112 and 114 receive data from other logic (not shown) within integrated circuit 110, and drive that data onto conductors 120 and 140. I/O circuits 112 and 114 are shown driving four bits of data, although this is not a limitation of the present invention. For example, in some embodiments, each of I/O circuits operate on more or less than four bits of data. Also, clock buffer 116 and I/O circuits 112 and 114 are shown driving single-ended signals on conductors 130, 120, and 140, respectively. In some embodiments, clock driver 116, I/O circuits 112, and 114 drive differential signals, and the number of physical conductors is double that shown in FIG. 1.

In some embodiments, I/O circuits 112 and 114 form high speed point-to-point serial link circuits. For example, in some embodiments, I/O circuits 112 and 114 operate in compliance with, or in partial compliance with, a high speed serial link standard such as a peripheral component interconnect (PCI) Express standard.

I/O circuits 112 and 114 receive a common clock signal from clock circuit 118, and use this clock signal to clock digital data to drive conductors 120 and 140. In some embodiments, each of I/O circuits 112 and 114 are designed to minimize skew between the various signal paths within the I/O circuit. For example, I/O circuit 112 may be designed to minimize skew between the signals driven on conductors 120, and I/O circuit 114 may be designed to minimize skew between the signals on conductors 140.

Conductors 120, 130, and 140 may be implemented as signal traces on a printed circuit board, wiring, cabling, or traces on an integrated circuit. These conductors may introduce skew between the various signals. For example, skew may be introduced between a clock signal on conductor 130 and data signals on conductors 120, or skew may be introduced between a clock signal on conductor 130 and data signals on conductors 140. Further, skew may be introduced between data signals on conductors 120 and data signals on conductors 140.

In some embodiments, conductors 120 are routed to minimize skew between the signals on conductors 120, and conductors 140 are routed to minimize skew between the signals on conductors 140. Accordingly, the skew between data signals arriving at integrated circuit 150 on conductors 120 is preferably kept small. Further, the skew between data signals arriving at integrated circuit 150 on conductors 140 is preferable kept small.

Integrated circuit 150 includes I/O nibble interface circuits 160 and 170, nibble de-skew control circuit 180, and delay line and interpolator circuits 162 and 172. Integrated circuit 150 may include many other circuits (not shown) such as memory arrays or other logic circuits. Further, integrated circuit 150 may include driver circuits in each of I/O nibble interface circuits 160 and 170 to drive data back to integrated circuit 110. These driver circuits, and other circuits, are intentionally omitted from FIG. 1 so as to not obscure that which is shown.

In operation, I/O nibble interface circuits 160 and 170 receive data on conductors 120 and 140, respectively. As described above, data on conductors 120 may be skewed relative to data on conductors 140 as well as relative to the clock signal on conductor 130. The combination of nibble de-skew control circuit 180 and delay line and interpolator circuits 162 and 172 operate to determine an appropriate clock phase to clock data into I/O nibble interface circuits 160 and 170. For example, delay line and interpolator circuit 162 receives a clock signal from conductor 130 and control signals from nibble de-skew control circuit 180, and provides a clock signal to I/O nibble interface circuit 160. Delay line and interpolator circuit 162 may include a tapped delay line that provides clock signals having various phases, and may select one of the clock signals from the tapped delay line to provide to I/O nibble interface circuit 160. Further, delay line and interpolator circuit 162 may also include one or more phase interpolator circuits to combine two or more clock signals from a tapped delay line to create a clock signal with an appropriate phase to provide to I/O nibble interface circuit 160. Delay line and interpolator circuit 172 provides similar functionality for I/O nibble interface circuit 170.

Integrated circuit 110 may send one or more training sequences of data to integrated circuit 150 to allow appropriate clock phases to be determined. For example, upon a system power-up or reset event, I/O circuit 112 may transmit a first training sequence on conductors 120. During reception of the training sequence, nibble de-skew control circuit 180 may cause delay line and interpolator circuit 162 to sweep the phase of the clock signal provided to I/O nibble interface circuit 160. Also for example, I/O circuit 114 may transmit a second training sequence on conductors 140. During reception of the training sequence, nibble de-skew control circuit 180 may cause delay line and interpolator circuit 172 to sweep the phase of the clock signal provided to I/O nibble interface circuit 170. I/O nibble interface circuits 160 and 170 provide feedback to nibble de-skew control circuit 180, which then determines an appropriate phase for each of I/O nibble interface circuits 160 and 170.

I/O nibble interface circuits 160 and 170 are shown receiving four bits of data each, but this is not a limitation of the present invention. For example, I/O nibble interface circuits 160 and 170 may each operate on more or less than four bits of data. Accordingly, the term "nibble," as used herein, is not limited to four bits. In contrast, the term "nibble" is used to describe less than all bits handled by a device. For example, integrated circuit 150 may be an eight bit memory device, and each of I/O nibble interface circuits 160 and 170 may operate on four bits. Also for example, integrated circuit 150 may be a 16 bit memory device, and each of I/O nibble interface circuits 160 and 170 may operate on eight bits. Further, integrated circuit 150 may include more than four I/O nibble interface circuits without departing from the scope of the present invention.

I/O nibble interface circuits 160 and 170 may be distributed about an integrated circuit die. For example, I/O nibble interface circuit 160 may be located on one end of an integrated circuit die, and I/O nibble interface circuit 170 may be located on another end of the same integrated circuit die. Distributing I/O nibble interfaces across an integrated circuit die may allow the I/O circuits to be tightly coupled to other circuits within the integrated circuit (e.g., memory arrays), and may also save routing resources within the integrated circuit. In some embodiments, nibble de-skew control circuit 180 may be centralized as shown in FIG. 1, or may distributed along with the I/O nibble interface circuits.

As shown in FIG. 1, de-skew is performed on a nibble by nibble basis, or "nibble de-skew" is performed. In embodiments represented by FIG. 1, conductor lengths within a nibble (both on and off integrated circuits) are matched closely to minimize skew within a nibble. In order to alleviate chip-to-chip routing constraints and allow for some on-chip nibble-to-nibble skew as well, an arbitrary skew from nibble-to-nibble is tolerated. Nibble de-skew is performed to correct any timing error induced by nibble-to-nibble skew. Nibble de-skew enables higher performance while balancing the power increase caused by additional de-skew circuitry. It is a compromise between bit-level de-skew and full-chip de-skew.

Figure 2:
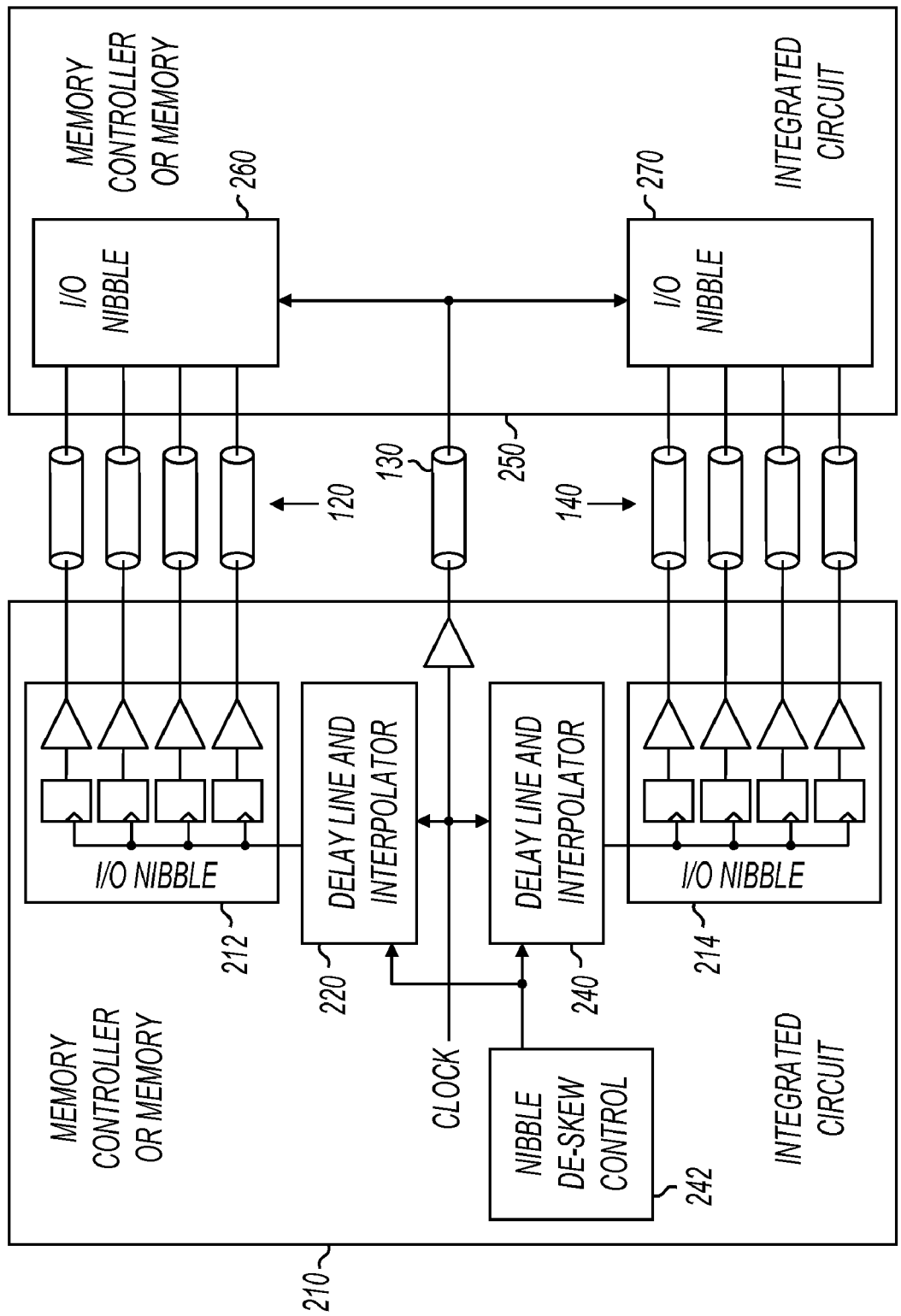

FIG. 2 shows two coupled integrated circuits. Integrated circuits 210 and 250, like integrated circuits 110 and 150 (FIG. 1) may be memory controllers or memory devices. For example, the interface between two integrated circuits shown in FIG. 2 may represent an interface between a memory controller and a memory device, an interface between two memory controllers, or an interface between two memory devices.

Integrated circuit 210 includes I/O nibble interface circuits 212 and 214, delay line and interpolator circuits 220 and 240, and nibble de-skew control 242. In embodiments represented by FIG. 2, nibble de-skew is performed by determining a clock phase for a clock signal used to transmit data rather than to receive the data. For example, delay line and interpolator circuit 220 is used to determine a phase of a clock signal that clocks data out of I/O nibble interface circuit 212, and delay line and interpolator circuit 240 is used to determine a phase of a clock signal that clocks data out of I/O nibble interface circuit 214. I/O nibble interface circuits 212 and 214 include transmitters to transmit data onto conductors 120 and 140.

Integrated circuit 250 includes I/O nibble interface circuits 260 and 270. Each of I/O nibble interface circuits 260 and 270 receive data and a clock signal. Because the data is nibble de-skewed prior to being transmitted by integrated circuit 210, further nibble de-skew is not necessary at integrated circuit 250.

In some embodiments, one or more training sequences is transmitted by integrated circuit 210, and integrated circuit 250 measures skew on a nibble basis. Integrated circuit 250 may transmit skew information back to integrated circuit 210 so nibble de-skew control circuit 242 may adjust the phase of clock signals used to clock data out of I/O nibble interface circuits 212 and 214.

Figure 3:
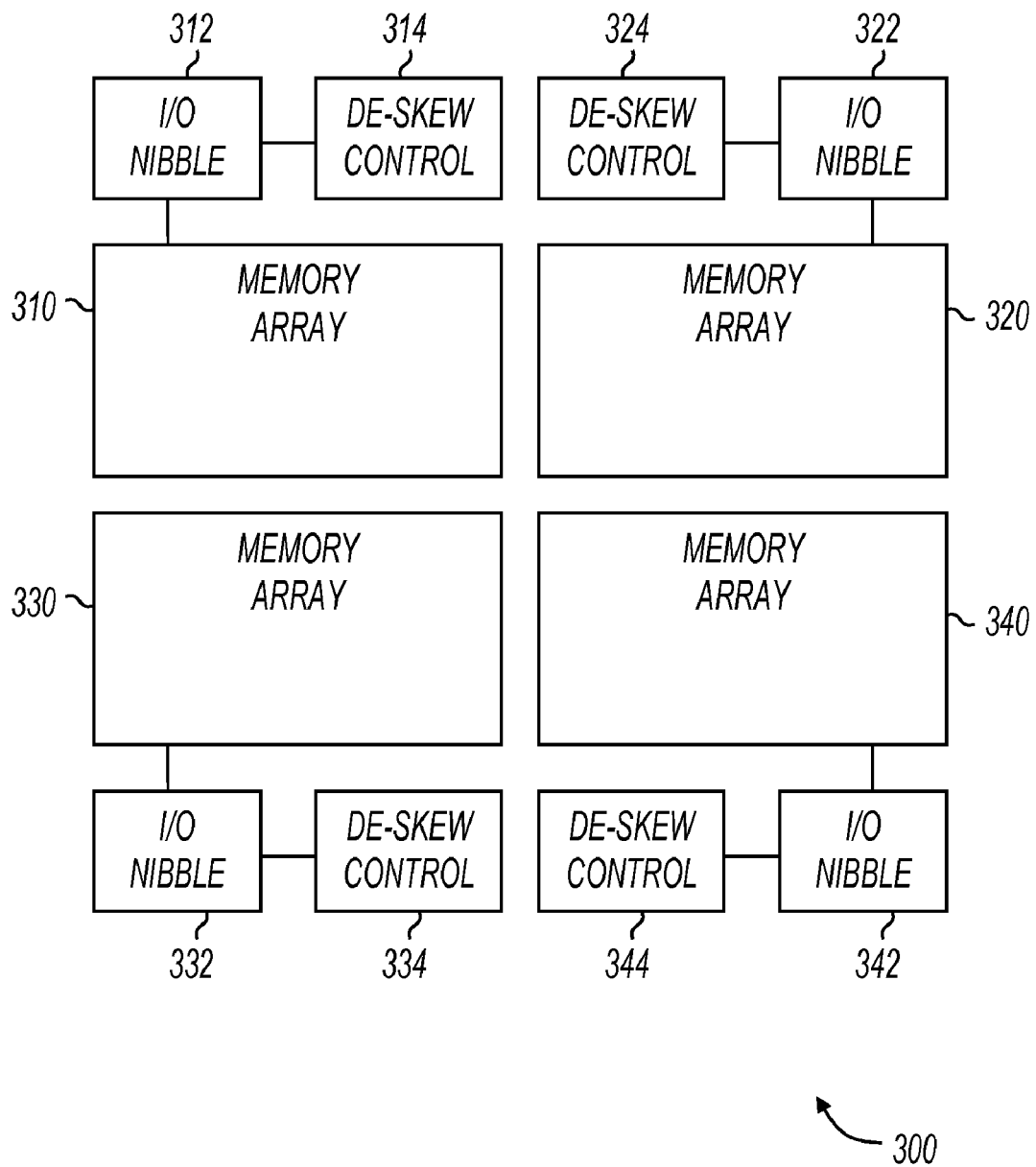
FIG. 3 shows a floorplan diagram of a memory device.

FIG. 3 shows a floorplan diagram of a memory device. Floorplan 300 shows four memory arrays 310, 320, 330, and 340; four I/O nibble interface circuits 312, 322, 332, and 342; and four nibble de-skew control circuits 314, 324, 334, and 344. Each memory array is coupled to one I/O nibble interface circuit, which is in turn coupled to one nibble de-skew control circuit. For example, memory array 310 and nibble de-skew control circuit 314 are coupled to I/O nibble interface circuit 312; memory array 320 and nibble de-skew control circuit 324 are coupled to I/O nibble interface circuit 322; memory array 330 and nibble de-skew control circuit 334 are coupled to I/O nibble interface circuit 332; and memory array 340 and nibble de-skew control circuit 344 are coupled to I/O nibble interface circuit 342.

As shown FIG. 3, I/O nibble interface circuits may be distributed about an integrated circuit die. Each I/O nibble interface circuit forms a segment of a larger I/O circuit, where de-skew is performed on a segment-by-segment basis. For example, the memory device represented by floorplan 300 performs nibble de-skew.

By distributing the I/O nibble interface circuits about an integrated circuit die, and performing nibble de-skew, design constraints may be loosened while still maintaining the desired memory I/O performance. For example, in embodiments represented by FIG. 3, a designer may be constrained to keep skew low within a nibble, but is free to allow an amount of skew between nibbles.

Figure 4:
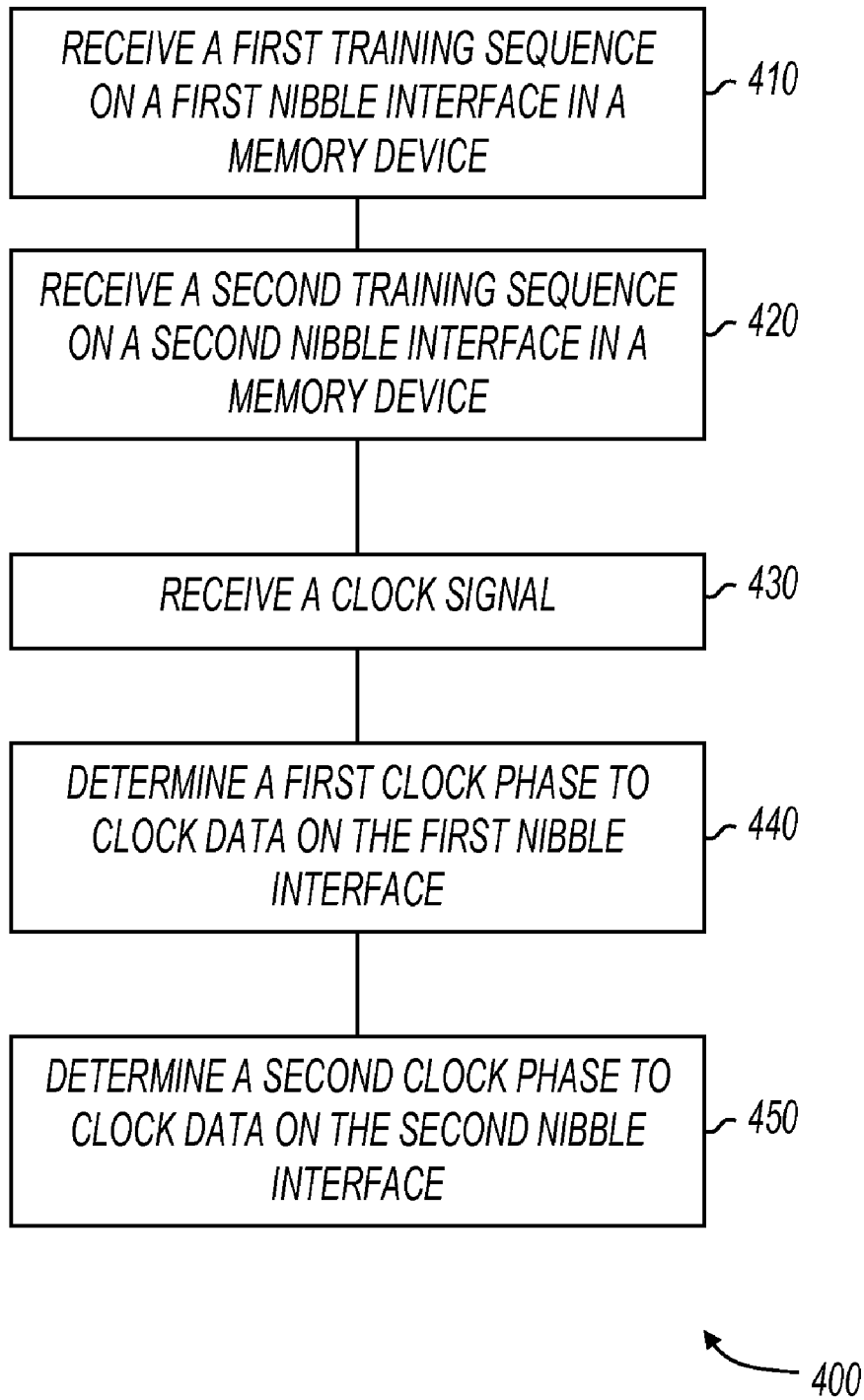
FIG. 4 shows a flowchart in accordance with various embodiments of the present invention.

FIG. 4 shows a flowchart in accordance with various embodiments of the present invention. In some embodiments, method 400 may be used to perform nibble de-skew. In some embodiments, method 400, or portions thereof, is performed by a nibble de-skew control circuit, embodiments of which are shown in the various figures. In other embodiments, method 400 is performed by a memory controller or chipset. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 begins at 410 in which a first training sequence is received on a first nibble interface in a memory device. In some embodiments, this corresponds to a memory controller transmitting a training sequence to a memory device during a power-up or reset event. The training sequence may include a sequence of digital data known to both the memory controller and the memory device. For example, the training sequence may include a sequence of alternating ones and zeros.

At 420, a second training sequence is received on a second nibble interface in the memory device. The actions of 410 and 420 may correspond to integrated circuit 150 (FIG. 1) receiving training sequences at I/O nibble interface circuits 160 and 170.

At 430, a clock signal is received. In some embodiments, the clock is received from the same source as the training sequences received at 410 and 420. For example, a memory controller with a source-synchronous interface may transmit both training sequences and the clock signal.

At 440, a first clock phase to clock data on the first nibble interface is determined, and at 450, a second clock phase to clock data on the second nibble interface is determined. Each of the first clock phase and second clock phase may be determined by one or more nibble de-skew control circuits such as those shown in the previous figures.

At the completion of the actions shown in method 400, nibble de-skew has been performed for two I/O nibble interface circuits. In some embodiment, nibble de-skew is performed for more than two nibble interfaces. Further, after nibble de-skew has been performed, data may be clocked into a nibble interface using a clock signal having the clock phase determined at 440 or 450.

Figure 5:
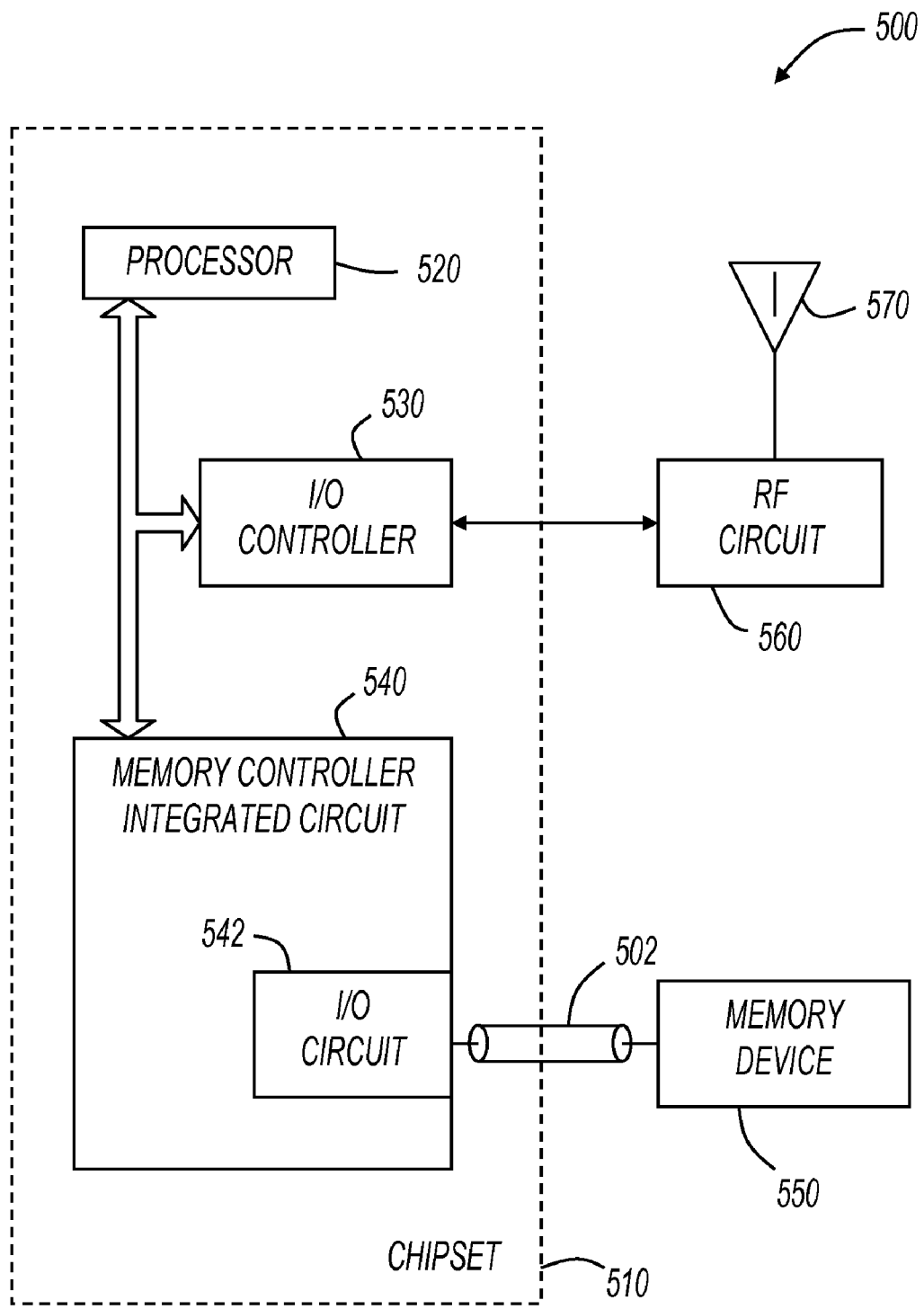
FIG. 5 shows a diagram of an electronic system in accordance with various embodiments of the present invention.

FIG. 5 shows a system diagram in accordance with various embodiments of the present invention. FIG. 5 shows system 500 including chipset 510, radio frequency (RF) circuit 560, antenna 570, memory device 550 and conductor 502. Chipset 510 includes processor 520, input output (I/O) controller 530, and memory controller 540. In operation, system 500 sends and receives signals using antenna 570, and these signals are processed by the various elements shown in FIG. 5. Antenna 570 may be a directional antenna or an omni-directional antenna. As used herein, the term omni-directional antenna refers to any antenna having a substantially uniform pattern in at least one plane. For example, in some embodiments, antenna 570 may be an omni-directional antenna such as a dipole antenna, or a quarter wave antenna. Also for example, in some embodiments, antenna 570 may be a directional antenna such as a parabolic dish antenna, a patch antenna, or a Yagi antenna. In some embodiments, antenna 570 may include multiple physical antennas.

Radio frequency circuit 560 communicates with antenna 570 and I/O controller 530. In some embodiments, RF circuit 560 includes a physical interface (PHY) corresponding to a communications protocol. For example, RF circuit 560 may include modulators, demodulators, mixers, frequency synthesizers, low noise amplifiers, power amplifiers, and the like. In some embodiments, RF circuit 560 may include a heterodyne receiver, and in other embodiments, RF circuit 560 may include a direct conversion receiver. In some embodiments, RF circuit 560 may include multiple receivers. For example, in embodiments with multiple antennas 570, each antenna may be coupled to a corresponding receiver. In operation, RF circuit 560 receives communications signals from antenna 570, and provides analog or digital signals to I/O controller 530. Further, I/O controller 530 may provide signals to RF circuit 560, which operates on the signals and then transmits them to antenna 570.

Memory controller 540 provides an interface between chipset 510 and memory devices such as memory device 550. Memory controller 540 includes I/O circuit 542 to communicate with memory device 550. For example, I/O circuit 542 is shown coupled to memory device 550 by conductor 502. Conductor 502 represents multiple conductors supporting a plurality of nibbles. For example, conductor 502 may include conductors 120, 130, and 140 (FIGS. 1, 2). I/O circuit 542 may include a plurality of segments. For example I/O circuit 542 may include a plurality of I/O nibble interface circuits, which are described with reference to previous figures. I/O circuit 542 may also include one or more nibble de-skew control circuits. I/O circuit 542 may include any of the nibble de-skew embodiments described herein.

Memory device 550 may include any of the nibble de-skew embodiments described herein. For example, memory device 550 may include multiple segments of an I/O circuit, where each segment includes a nibble de-skew circuit. Further, memory device 550 may include multiple memory devices where each of the memory devices includes multiple I/O nibble interface circuits, and one or more nibble de-skew control circuits.

Chipset 510 may include any number of integrated circuits, or "chips," and may have any level of integration. For example, in some embodiments, chipset 510 includes processor 520 and memory controller 540 in separate packages. Also for example, in some embodiments, chipset 510 may include processor 520 and memory controller 540 on the same integrated circuit die, or on separate integrated circuit die packaged together.

Example systems represented by FIG. 5 include cellular phones, personal digital assistants, wireless local area network interfaces, or any other suitable system. Many other systems uses for nibble de-skew exist. For example, chipset 510 may be used in a desktop computer, a network bridge or router, or any other system without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A memory controller comprising:

a segmented input/output (I/O) circuit including a plurality of segments, wherein each of the plurality of segments includes transmitters for at least two bits of data, and wherein each of the plurality of segments includes a separate clock input to allow the plurality of segments to receive different clock signals having independent phases;
a clock circuit; and
a plurality of interpolation circuits coupled to receive a clock signal from the clock circuit and to source the different clock signals having independent phases to the plurality of segments.

2. The memory controller of claim 1 wherein each of the plurality of segments includes transmitters for four bits of data.

3. The memory controller of claim 1 wherein the I/O circuit comprises a PCI Express compliant serial link circuit.

4. The memory controller of claim 1 further comprising a control circuit to influence operation of the plurality of interpolation circuits.

5. The memory controller of claim 4 wherein the control circuit is coupled to set interpolation values in each of the plurality of interpolation circuits in response to feedback received from a memory device coupled to the I/O circuits.

6. The memory controller of claim 1 wherein the plurality of segments includes at least two segments to be coupled to a first memory device and at least two segments to be coupled to a second memory device.

7. A memory controller integrated circuit comprising:
a plurality of four bit input/output (I/O) circuits;
a plurality of clock interpolator circuits, each of the plurality of clock interpolator circuits coupled to provide a phase interpolated clock signal to a corresponding one of the plurality of four bit I/O circuits;
a single clock input to receive a single clock signal; and
routing to provide the single clock signal to the plurality of clock interpolator circuits.

8. The memory controller integrated circuit of claim 7 further comprising a control circuit to influence operation of the plurality of clock interpolator circuits.

9. The memory controller integrated circuit of claim 8 wherein the control circuit is coupled to set interpolation values in each of the plurality of clock interpolator circuits in response to feedback received from the plurality of four bit I/O circuits.

10. A memory controller comprising:
a plurality of input/output (I/O) circuits distributed about the memory controller, each of the plurality of I/O circuits having a separate clock input to allow the plurality of I/O circuits to receive different clock signals having independent phases; and
a plurality of de-skew circuits, wherein each of the plurality of de-skew circuits is coupled to a corresponding one of the plurality of I/O circuits, and wherein each of the plurality of de-skew circuits includes a clock interpolator to source a clock signal having an independent phase to the corresponding one of the plurality of I/O circuits.

11. The memory controller of claim 10 wherein each of the plurality of I/O circuits comprises a four bit I/O circuit.

12. The memory controller of claim 11 wherein each of the plurality of de-skew circuits comprises a clock interpolator to source a single clock signal for a corresponding four bit I/O circuit.

13. The memory controller of claim 10 further comprising a clock circuit to source the clock signal to the plurality of de-skew circuits.

14. The memory controller of claim 13 further comprising a control circuit coupled to influence the operation of the plurality of de-skew circuits.

15. The memory controller of claim 10 wherein each of the plurality of de-skew circuits comprises a clock interpolator to source a single clock signal to a corresponding one of the plurality of I/O circuits.

16. An electronic system comprising:
an antenna;
a radio frequency circuit coupled to the antenna;
a processor coupled to the radio frequency circuit;
a memory device; and
a memory controller coupled to the processor and the memory device, the memory controller having a plurality of input/output (I/O) circuits coupled to the memory device, the plurality of I/O circuits distributed about the memory controller, and a plurality of de-skew circuits, wherein each of the plurality of de-skew circuits is coupled to a corresponding one of the plurality of I/O circuits, and wherein each of the plurality of de-skew circuits includes a clock interpolator to source a clock signal having an independent phase to the corresponding one of the plurality of I/O circuits.

17. The electronic system of claim 16 wherein the memory device is an eight bit wide memory device, and the plurality of I/O circuits comprises two four bit I/O circuits coupled to the memory device.

18. The electronic system of claim 17 wherein each of the plurality of de-skew circuits comprises a clock interpolator to source a single clock signal for a corresponding four bit I/O circuit.

19. The electronic system of claim 16 wherein the memory controller further comprises a clock circuit to source the clock signal to the plurality of de-skew circuits.

20. The electronic system of claim 19 wherein the memory controller further comprises a control circuit coupled to influence the operation of the plurality of de-skew circuits.

* * * * *